(12) United States Patent
Han

(10) Patent No.: US 6,660,573 B2
(45) Date of Patent: Dec. 9, 2003

(54) METHOD OF FORMING A GATE ELECTRODE IN A SEMICONDUCTOR DEVICE AND METHOD OF MANUFACTURING A NON-VOLATILE MEMORY DEVICE USING THE SAME

(75) Inventor: Myoung-Sik Han, Suwon-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/179,219

(22) Filed: Jun. 26, 2002

(65) Prior Publication Data

US 2003/0017657 A1 Jan. 23, 2003

(30) Foreign Application Priority Data

Jun. 29, 2001 (KR) .......................... 2001-37959

(51) Int. Cl.⁷ .......................... H01L 21/00; H01L 21/84
(52) U.S. Cl. .................. 438/149; 438/631; 438/645
(58) Field of Search ................. 438/149, 162, 438/230, 366, 551, 631, 645

(56) References Cited

U.S. PATENT DOCUMENTS 6,132,637 A * 10/2000 Hosali et al. .............. 252/79.1
6,210,998 B1 * 4/2001 Son

* cited by examiner

Primary Examiner—Phuc T. Dang
(74) Attorney, Agent, or Firm—Lee & Sterba, P.C.

(57) ABSTRACT

A method of forming a gate electrode, capable of minimizing a resistance difference between the gate electrodes and a method of forming a non-volatile memory device using the same, wherein an oxide film pattern, a polysilicon layer pattern and a hard mask pattern are stacked on a semiconductor substrate to form a gate structure; a gate spacer including an oxide-based insulating material is formed on a sidewall of the gate structure; the hard mask pattern stacked on the gate structure is removed to expose the polysilicon layer pattern; the polysilicon layer pattern and the top portion of the gate spacer are planarized; a stopping layer and an insulating interlayer are then formed and planarized by CMP. Thus, the thickness of the films for forming the gate electrode and, consequently the gate electrode resistance of a semiconductor device, are uniform across the wafer.

29 Claims, 21 Drawing Sheets

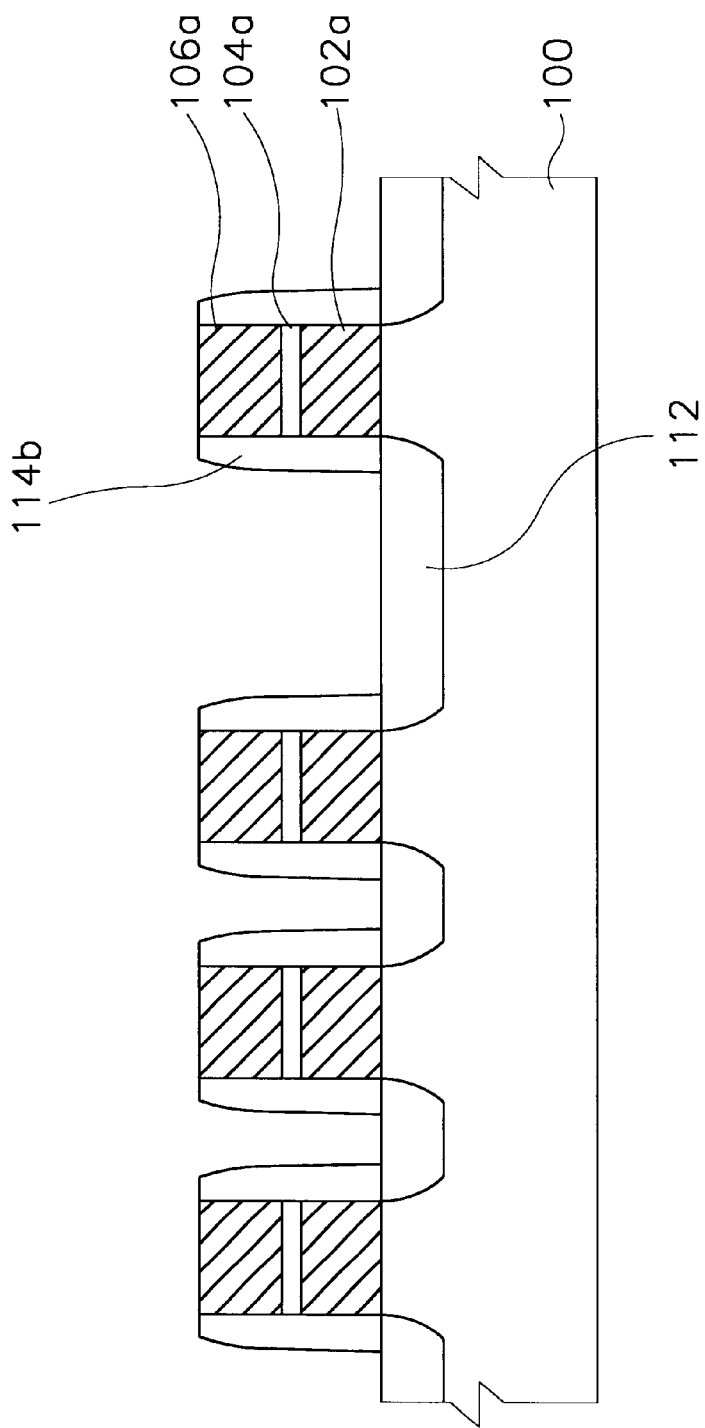

METHOD OF FORMING A GATE ELECTRODE IN A SEMICONDUCTOR DEVICE AND METHOD OF MANUFACTURING A NON-VOLATILE MEMORY DEVICE USING THE SAME

BACKGROUND OF THE INVENTION

1. Field of the Invention

The present invention relates to a method of manufacturing a semiconductor device. More particularly, the present invention relates to a method of manufacturing a semiconductor device comprising a gate electrode.

2. Description of the Related Art

There are two types of semiconductor memory devices. The first type is known as a RAM and the second type is known as a ROM. The RAM devices, such as a DRAM and an SRAM, are volatile (i.e., data is erased when power to the memory cell is turned off) and data is quickly inputted and outputted. The ROM is non-volatile and data is more slowly inputted and outputted. Among the ROM devices, demand is great for EEPROM (electrically erasable and programmable ROM) or a flash memory in which data is electrically inputted and outputted.

A fundamental structure in a semiconductor device is a transistor, which generally include a gate electrode. The gate electrode that is included in a respective cell of the semiconductor device is required to have a fine line width and a low resistance. Furthermore, the gate electrode needs to have a constant resistance value for all memory cell transistors across a wafer in order to improve reliability of inputting and outputting of data to and from the respective cell.

FIGS. 1A to 1E illustrate sectional views of stages in a conventional method of manufacturing a non-volatile memory device.

Referring to FIG. 1A, a gate oxide film (not shown) is formed on a semiconductor substrate 10 having a field area and an active area divided by a conventional isolation process. A conductive layer is formed on the gate oxide film in order to form a floating gate. After forming a dielectric film on the conductive layer, a polysilicon layer is formed on the dielectric film, which is used for a control gate. An insulating material, such as a nitride, is deposited to a thickness of 800-1500 Å on the polysilicon layer to form a hard mask layer.

The hard mask layer is patterned via a photolithography process to form a hard mask pattern 18 for patterning the gate electrode. The polysilicon layer, the dielectric film and the conductive layer are then continuously and anisotropically etched using the hard mask pattern 18 as an etching mask, thereby forming a gate structure 20 in which a gate oxide film pattern (not shown), the conductive pattern 12, the dielectric pattern 14 and the polysilicon pattern 16 and the hard mask pattern 18 are stacked.

When the anisotropic etching is performed in order to form the gate structure 20, the hard mask pattern 18 used as the etching mask also is partially etched due to the impact of an ion beam. However, the hard mask pattern 18 on the polysilicon layer pattern 16 is not etched to a uniform thickness throughout a whole pattern as a result of the etching. Accordingly, the hard mask pattern 18 has a non-uniform thickness within one gate structure 20 and also among various gate structures across a wafer.

Referring to FIG. 1B, an insulating material, such as an oxide, is deposited on the resultant structure shown in FIG. 1A. Then, the insulating material is anisotropically etched to form a gate spacer 22. A stopping layer 24 having a thickness of 500-800 Å is continuously formed on the gate spacer 22, the semiconductor substrate 10 and the gate structure 20. The stopping layer 24 includes an insulating material, such as a nitride. The stopping layer 24 indicates a stopping point when performing a subsequent polishing process for an insulating interlayer and is also used to self-align the contacts when forming contacts between the gate electrodes in a subsequent process.

Referring to FIG. 1C, as described above, a nitride film 26, which includes the hard mask pattern 18 and the stopping layer 24, is deposited on the respective polysilicon layer pattern 16. Even though the stopping layer 24 is uniformly deposited, the nitride film 26 which includes the hard mask pattern and the stopping layer may not have a uniform thickness because of a non-uniform thickness of the hard mask pattern 18 remaining on the respective polysilicon layer pattern 16.

As shown in FIGS. 1C and 1D, an insulating interlayer 28 is then formed to cover the resultant structure shown in FIG. 1B, which includes the stopping layer 24. Then, a planarization process is performed to expose the polysilicon layer pattern 16.

Referring firstly to FIG. 1C, the insulating interlayer 28 is formed in order to cover the resultant structure, including the stopping layer 24. Then, the insulating interlayer 28 is chemically and mechanically polished to expose the stopping layer 24, as shown in FIG. 1C. In order to perform the polishing process for exposing the stopping layer 24, a polishing rate of the nitride film should be slower than the polishing rate of the insulating interlayer oxide film 28.

As described above, since the nitride film 26, which is a top layer of the respective gate structure, has a non-uniform thickness, the nitride film 26 remaining on the polysilicon layer pattern 16 also has a non-uniform thickness after the chemical and mechanical polishing.

Referring now to FIG. 1D, the stopping layer 24 covering the hard mask pattern and the hard mask pattern 18 are removed to expose the polysilicon layer pattern 16. That is, the nitride film 26 formed on the polysilicon layer pattern 16 is removed. The removal of the nitride film 26 is carried out via a dry etching or a wet etching process.

Since the nitride film 26 formed on the respective polysilicon layer pattern 16 has a non-uniform thickness, the polysilicon layer pattern 16 also has a non-uniform thickness. Similarly, an exposed portion of the polysilicon layer pattern 16 has a different area at different locations across the wafer 10 when the nitride film 26 is removed.

Particularly, when the dry etching is performed to remove the nitride film 26, the polysilicon layer pattern 16 is continuously and gradually etched at a portion in which the nitride film 26 remaining on the polysilicon layer pattern 16 is thin so that the thickness of the polysilicon layer pattern 16 is reduced at that portion by the time the nitride film 26 is completely etched on the entire polysilicon layer pattern 16. Furthermore, the gate spacer 22 is also etched thereby exposing a sidewall of the polysilicon layer pattern 16. Therefore, after the nitride film 26 is completely etched, the thickness of the polysilicon layer pattern 16 is thinner at the portion where the thickness of the nitride film 26 on the polysilicon layer pattern 16 was thinner before the etching rather than at a portion where the thickness of the nitride film 26 was thicker before the etching.

If the nitride film 26 is removed by a wet etching, an etchant penetrates into the sidewall of the gate spacer 22 so that a portion of the stopping layer 24 formed on the sidewall of the gate spacer 22 is removed. At that time, the portion of the stopping layer 24a formed on the sidewall of the gate spacer 22 is removed non-uniformly due to the non-uniformity in the thickness of the nitride film 26. Accordingly, the sidewall of the respective polysilicon layer pattern has a different exposed area.

Referring to FIG. 1E, a metal silicide layer 30 is selectively deposited on the exposed polysilicon layer pattern 16 to form a gate electrode. However, an area where the metal silicide layer 30 is formed is different at different locations because an area where the polysilicon layer pattern 16 is exposed is different at different locations on the wafer. Further, since the polysilicon layer pattern 16 has non-uniform thickness, the thickness of the gate electrode varies within one gate stack and also at different locations across the wafer.

As described above, in a conventional process of making a non-volatile memory device, since the polysilicon layer pattern for forming the gate electrode is formed non-uniformly, the gate electrodes have varying resistances at different locations across the wafer surface. Accordingly, the reliability of the semiconductor device is reduced.

SUMMARY OF THE INVENTION

The present invention is intended to solve the aforementioned non-uniform gate resistance problem, and accordingly it is a first feature of an embodiment of the present invention to provide a method of forming a gate electrode in which a non-uniformity in a resistance thereof is reduced.

It is a second feature of an embodiment of the present invention to provide a method of manufacturing a non-volatile semiconductor device having a gate electrode in which the non-uniformity in the resistance of the gate electrode is reduced.

To provide the first feature of an embodiment of the present invention, a method of forming a gate electrode of a semiconductor device is provided. In the method of forming a gate electrode of a semiconductor device, an oxide film pattern, a polysilicon layer pattern and a hard mask pattern in that order are sequentially stacked on a semiconductor substrate to form a gate structure. A gate spacer is formed on a sidewall of the gate structure, wherein the gate spacer includes an oxide-based insulating material. The hard mask pattern, which is stacked on a top portion of the gate structure, is removed to expose the polysilicon layer pattern. The polysilicon layer pattern and a top portion of the gate spacer are planarized by removing a top portion of the gate spacer that was around the hard mask pattern and projected above the polysilicon layer pattern.

The method of forming a gate electrode of a semiconductor device may further include continuously forming a stopping layer on the polysilicon layer pattern, the gate spacer and the semiconductor substrate; forming an insulating interlayer on the stopping layer; and exposing a surface of the polysilicon layer pattern by planarizing the insulating interlayer. Exposing the surface of the polysilicon layer pattern by planarizing the insulating interlayer may include performing a chemical and mechanical polishing until the surface of the stopping layer is exposed and etching the exposed stopping layer to expose the surface of the polysilicon layer pattern.

The method of forming a gate electrode of a semiconductor device may further include selectively forming a metal silicide layer on the surface of the exposed polysilicon layer after the surface of the polysilicon layer pattern is exposed.

To provide the second feature of an embodiment of the present invention, a method of forming a non-volatile semiconductor device is provided. In the method of forming a non-volatile semiconductor device, an oxide film, a conductive layer, a dielectric layer, a polysilicon layer and a hard mask layer comprised of a nitride film in that order are sequentially formed on a semiconductor substrate. A predetermined portion of the hard mask layer is etched to form a hard mask pattern. The polysilicon layer, the dielectric layer, the conductive layer and the oxide film are sequentially etched using the hard mask pattern as an etching mask to form a gate structure in which an oxide film pattern, a conductive layer pattern, a dielectric layer pattern, a polysilicon layer pattern and a hard mask pattern are stacked on the semiconductor substrate. A gate spacer is formed on a sidewall of the gate structure, wherein the gate spacer includes an oxide-based insulating material. The hard mask pattern, which is stacked on a top portion of the gate structure, is removed to expose the polysilicon layer pattern. The polysilicon layer pattern and a top portion of the gate spacer are planarized by removing a top portion of the gate spacer that was around the hard mask pattern and projected above the exposed polysilicon layer pattern. A continuous stopping layer is then formed on the resulting exposed polysilicon layer pattern, the gate spacer and the semiconductor substrate. After forming an insulating interlayer on the stopping layer, the surface of the polysilicon layer pattern is exposed by planarizing the insulating interlayer.

In the method of forming a non-volatile semiconductor device, exposing a surface of the polysilicon layer pattern by planarizing the insulating interlayer may include performing a chemical and mechanical polishing until a surface of the stopping layer is exposed and etching the exposed stopping layer to expose the surface of the polysilicon layer pattern. The method of forming a non-volatile semiconductor device may further include selectively forming a metal silicide layer on the surface of the exposed polysilicon layer after exposing the surface of the polysilicon layer pattern.

According to the present invention, since subsequent processes are performed after removing the hard mask pattern, the respective film forming the gate electrode has a uniform thickness while being uniformly exposed. Therefore, it is possible to manufacture the semiconductor device having a gate electrode with a reduced difference in a thickness thereof and, consequently, in the gate resistance across the wafer.

BRIEF DESCRIPTION OF THE DRAWINGS

The above and other features and advantages of the present invention will become readily apparent to those of ordinary skill in the art by reference to the following detailed description when considered in conjunction with the accompanying drawings wherein:

FIGS. 3A to 3K illustrate sectional views of stages in a method of forming a non-volatile memory device according to a second embodiment of the present invention.

DETAILED DESCRIPTION OF THE INVENTION

Korean Patent Application No. 2001-37959, filed on Jun. 29, 2001, and entitled: "Method of Forming a Gate Electrode in Semiconductor Device and Method of Manufacturing a Non-Volatile Memory Device Using the Same," is incorporated by reference herein in its entirety.

Hereinafter, the embodiments of the present invention will be described in detail with reference to the accompanying drawings.

FIGS. 2A to 2J illustrate sectional views of stages in a method of forming a gate electrode in a semiconductor device according to a first embodiment of the present invention.

Figure 1A:
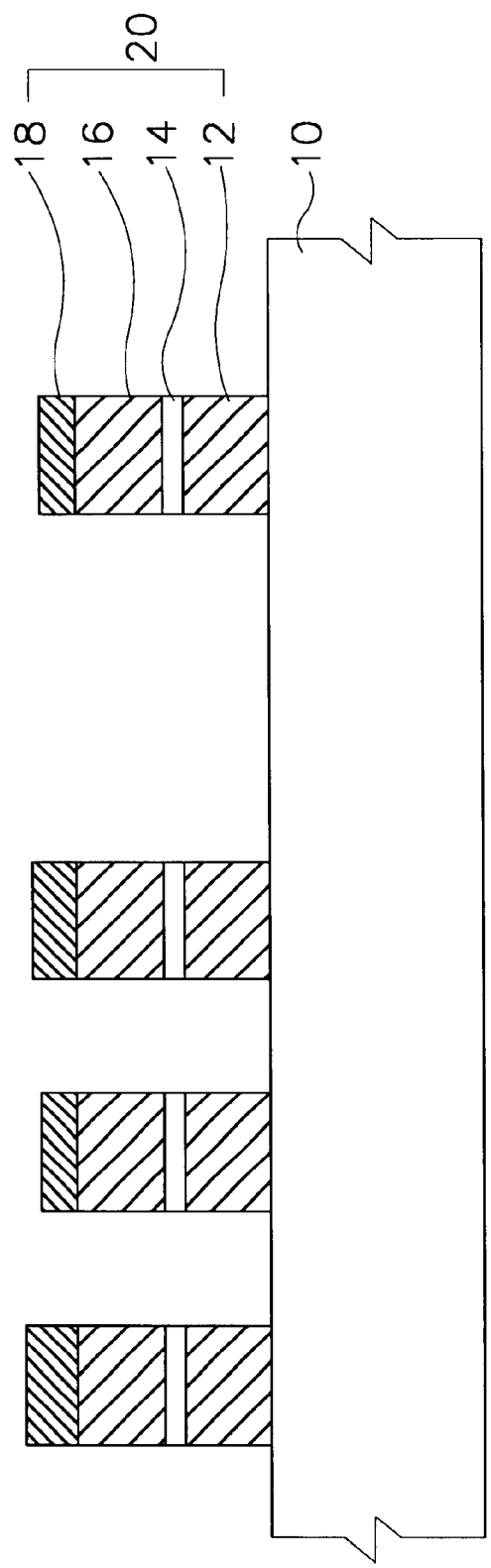
FIGS. 1A to 1E illustrate sectional views of stages in a conventional method of forming a non-volatile memory device.
Figure 1B:
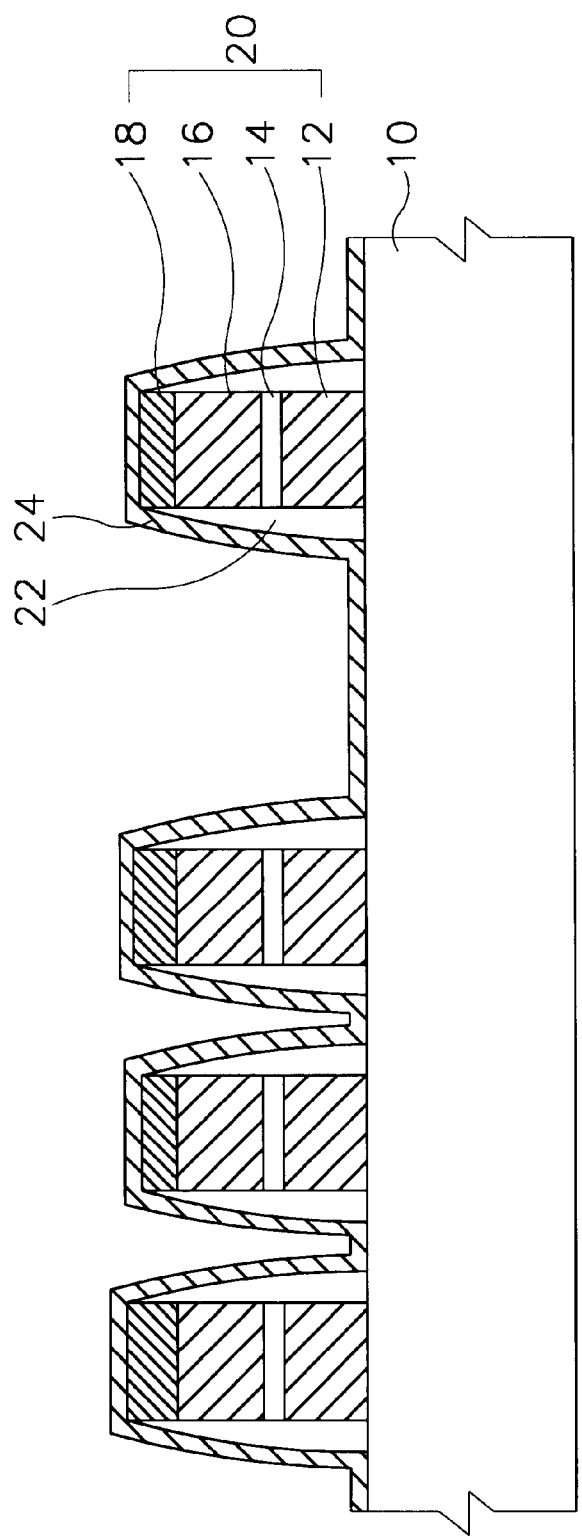
Figure 1C:
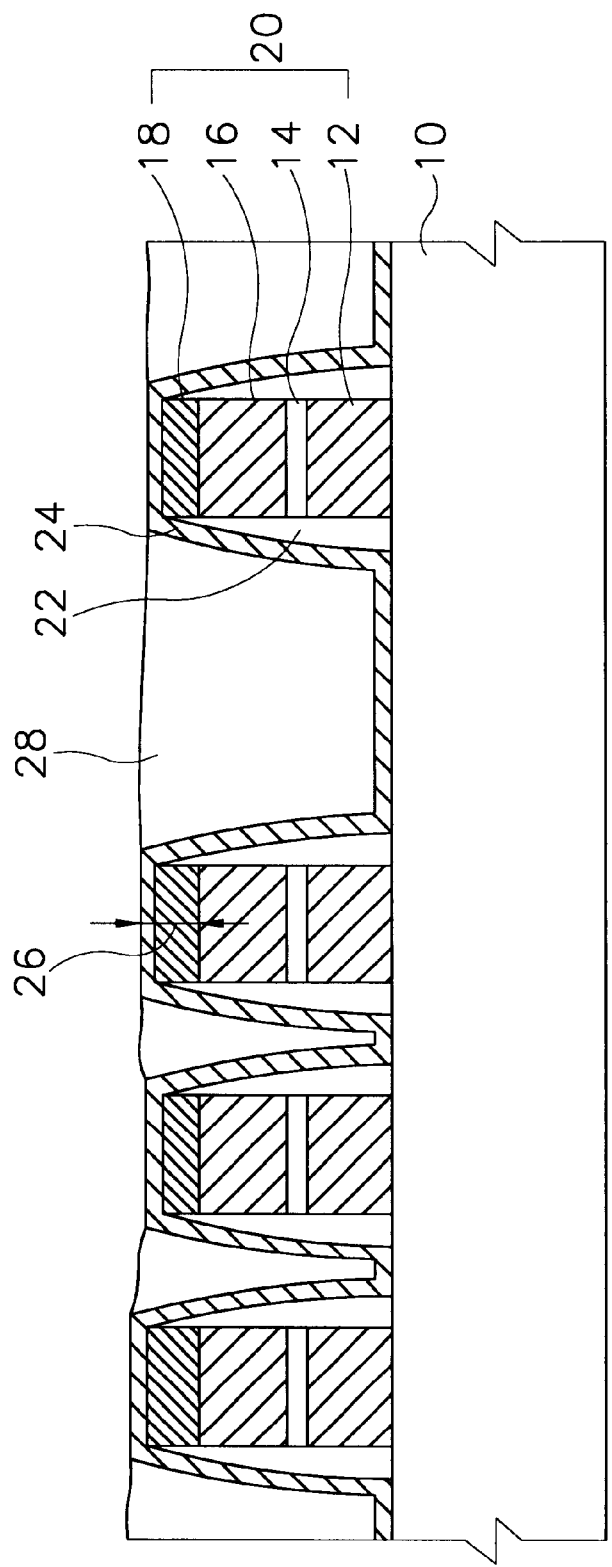
Figure 1D:
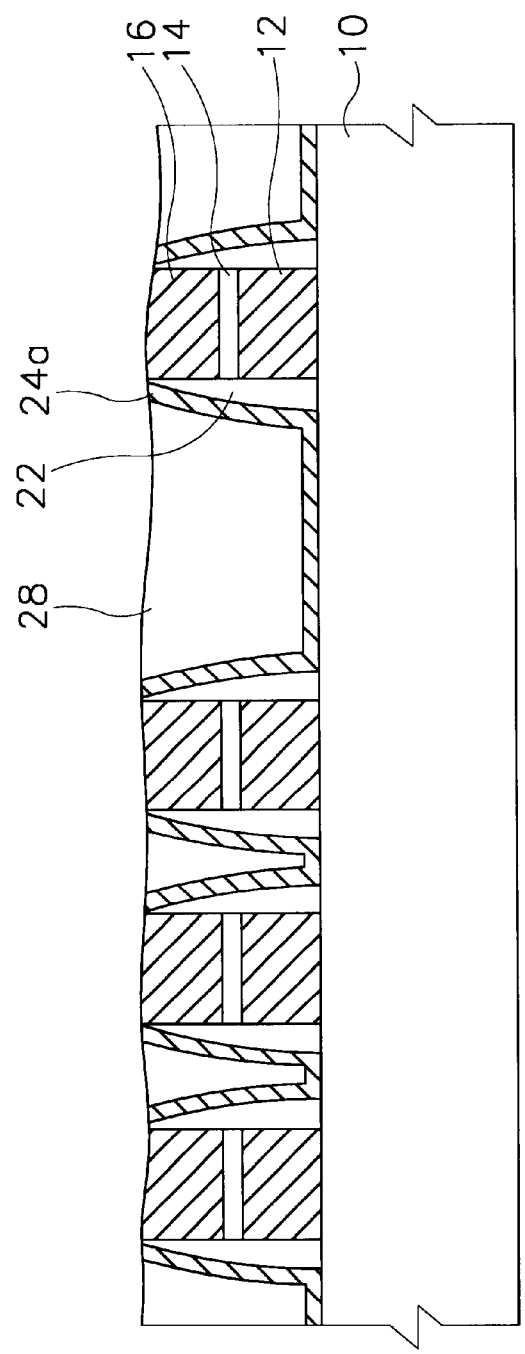
Figure 1E:
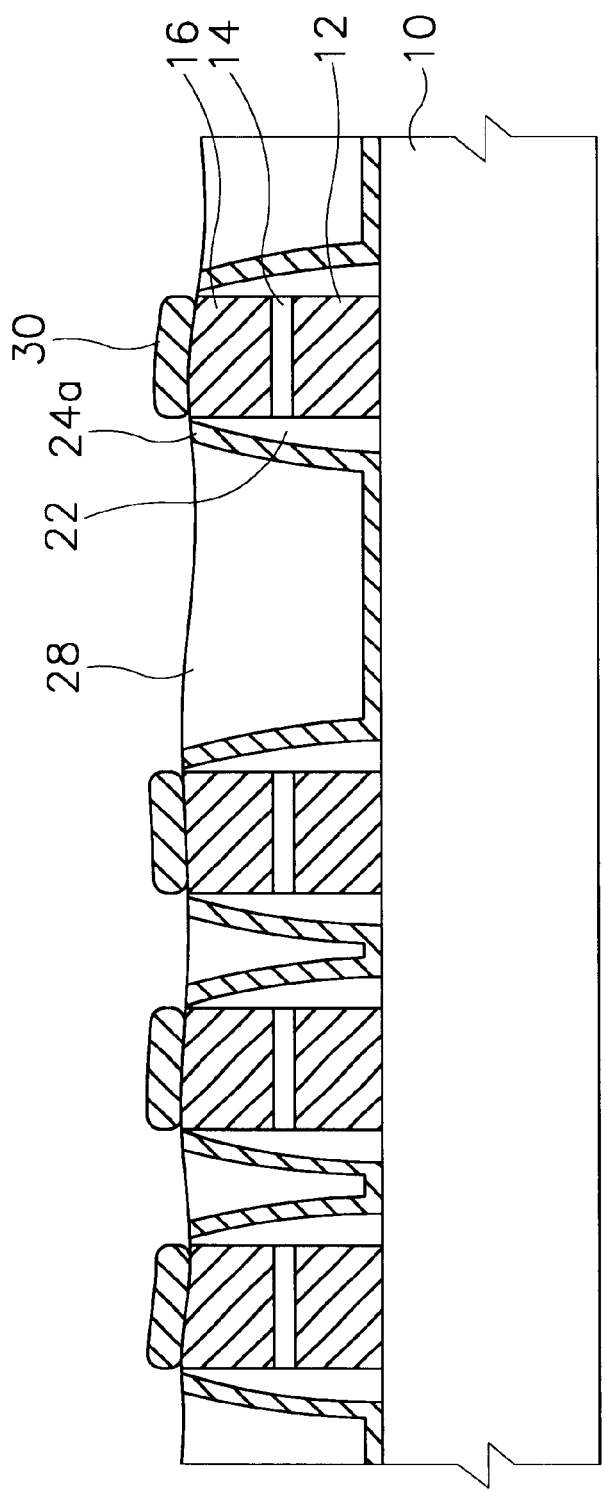
Figure 2A:
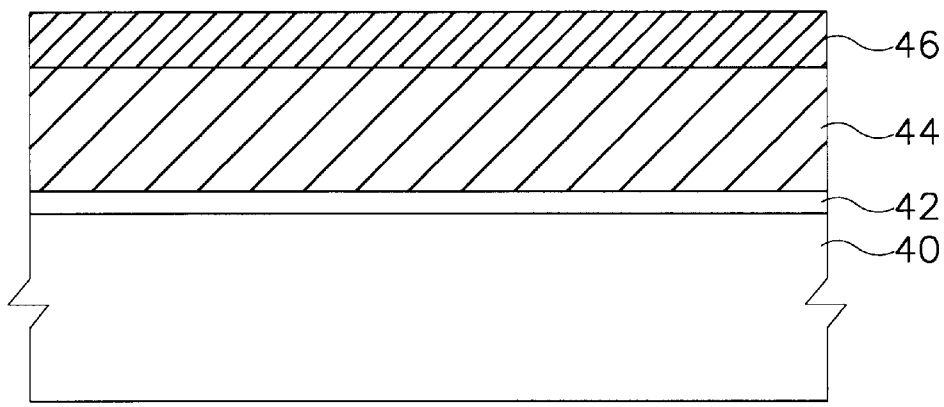
FIGS. 2A to 2J illustrate sectional views of stages in a method of forming a gate electrode in a semiconductor device according to a first embodiment of the present invention.

Referring to FIG. 2A, a semiconductor substrate 40, including a material such as silicon, is divided into an active area and a field area by a conventional isolation process (not shown). A silicon oxide film is grown on the semiconductor substrate 40 having the active area and the field area to form a gate oxide film 42 of a cell transistor.

Polysilicon, which is doped with impurities to make it highly conductive, is deposited on the gate oxide film 42 to form a polysilicon layer 44. An insulation material, such as a nitride, is deposited on the polysilicon layer 44 to form a hard mask layer 46, which is used as an etching mask in a subsequent etching process. Preferably, the hard mask layer 46 includes a nitride based insulating materials, such as a silicon nitride film or a silicon oxynitride film.

Figure 2B:
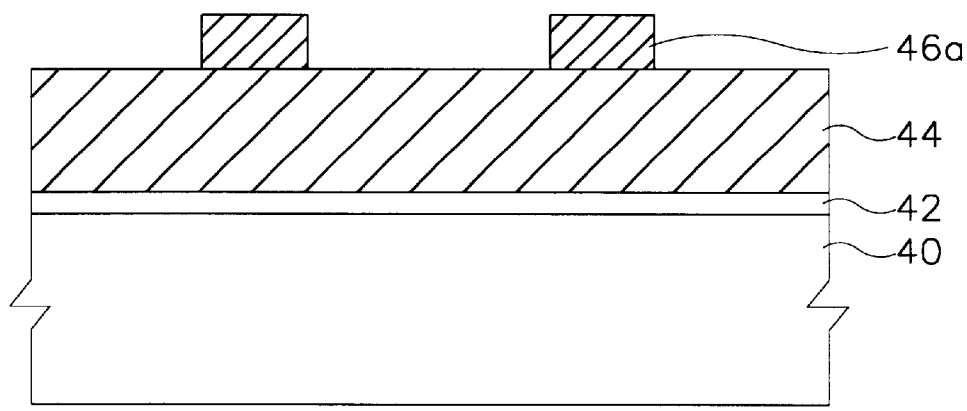

Referring to FIG. 2B, a predetermined portion of the hard mask layer 46 is etched by a photolithography process so that a hard mask pattern 46a is formed. The hard mask nitride film remains only where the gate electrode is to be formed. The hard mask pattern 46a is used as an etching mask for forming a gate structure in a subsequent process.

Figure 2C:
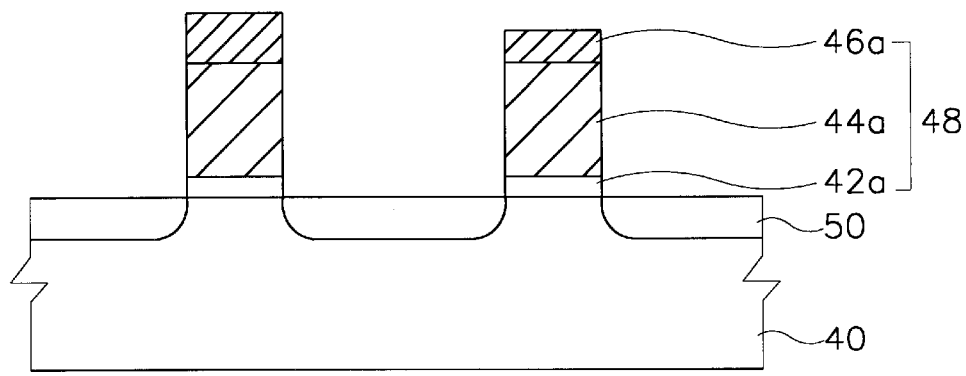

Referring to FIG. 2C, the lower films are continuously and anisotropically etched using the hard mask pattern 46a as an etching mask in order to form a gate structure 48 in which the hard mask pattern 46a, a polysilicon layer pattern 44a and the gate oxide film pattern 42a are stacked.

Using the gate structure 48 as an ion implanting mask, impurities are implanted into the semiconductor substrate 40 so that source/drain regions 50 are formed under a surface of the semiconductor substrate 40.

When the anisotropic etching is performed in order to form the gate structure 48, however, a surface of the hard mask pattern 46a used as the etching mask is partially etched due to an impact of an ion beam used for the anisotropic etching. The respective hard mask pattern 46a is differently and non-uniformly etched due to a difference in the density of a peripheral pattern or a position of the hard mask pattern on the semiconductor substrate. Therefore, the hard mask pattern 46a remaining on the top of the respective gate structure 48 has a non-uniform thickness after the etching process is performed.

Figure 2D:
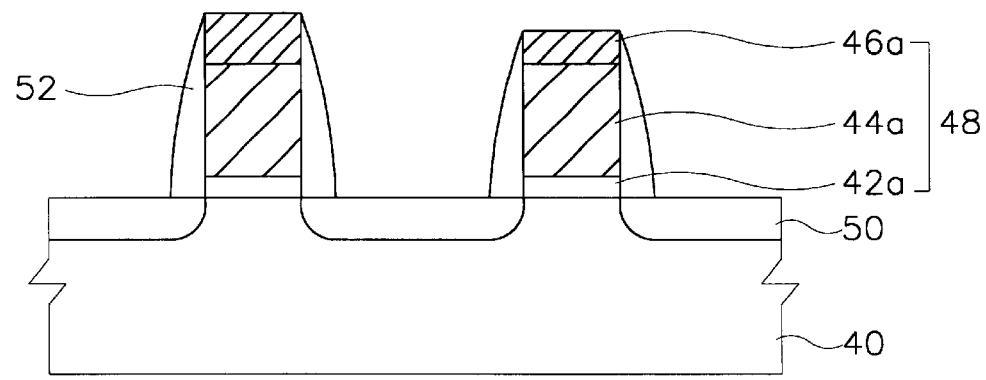

Referring to FIG. 2D, an oxide film is formed on the resulting gate structure 48 and the semiconductor substrate 40, shown in FIG. 2C. Then, the oxide film is anisotropically etched to form a gate spacer 52 on a sidewall of the gate structure 48.

Figure 2E:
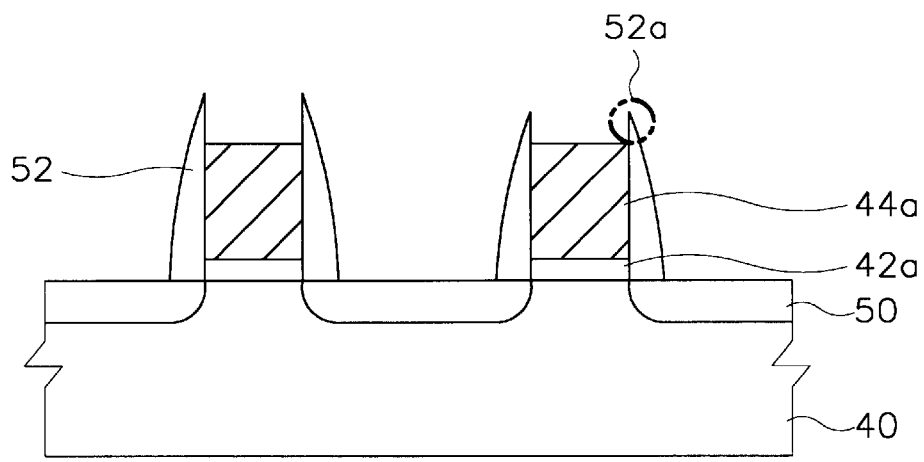

Referring to FIG. 2E, the hard mask pattern 46a remaining on the top of the gate structure 48 is removed to expose a surface of the polysilicon pattern 44a.

The hard mask pattern 46a is removed by dipping in an etchant, such as a chemical stripping solution including a phosphoric acid ($H_3PO_4$). Alternatively, the hard mask pattern 46a may be removed in a dry etching process. In the case of the dry etching process, however, a process defect including a substrate defect can occur since an impact of an ion beam used for dry etching is applied to a surface of the semiconductor substrate 40 where the polysilicon layer pattern 44a is not formed. Therefore, the hard mask pattern 46a is preferably removed in the phosphoric acid wet etch stripping process.

The resulting exposed polysilicon layer pattern 44a will have a uniform thickness after the removal of the hard mask pattern 46a having a non-uniform thickness, at this stage of processing the gate electrode, using the phosphoric acid wet etching. After the removal of the hard mask pattern 46a, a top portion 52a of the gate spacer that was around the hard mask pattern 46a projects above the polysilicon layer pattern 44a.

Figure 2F:
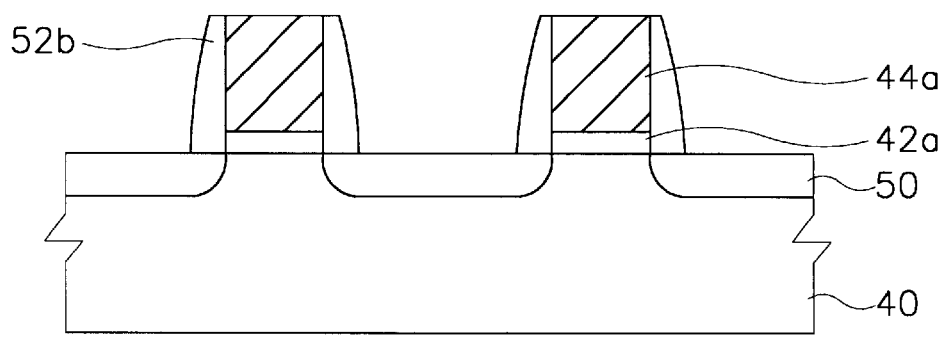

Referring to FIG. 2F, a top portion of the gate spacer 52a that was formed around the hard mask pattern 46a and projected above the polysilicon layer pattern 44a is removed to planarize the top portions of the polysilicon layer pattern 44a and the gate spacer 52, resulting a new gate spacer structure 52b.

For planarizing the top portions of the polysilicon layer pattern 44a and the gate spacer 52 and to obtain the structure shown in FIG. 2F, the semiconductor substrate including the projected gate spacer 52a, shown in FIG. 2E is dipped in a hydrofluoric acid (HF) solution for thirty seconds. When the semiconductor substrate is immersed in the hydrofluoric acid solution, the projected portion of the gate spacer 52a can be removed by an etching characteristic of the hydrofluoric acid while the exposed surface of the semiconductor substrate and the polysilicon layer pattern 44a are cleaned.

Figure 2G:
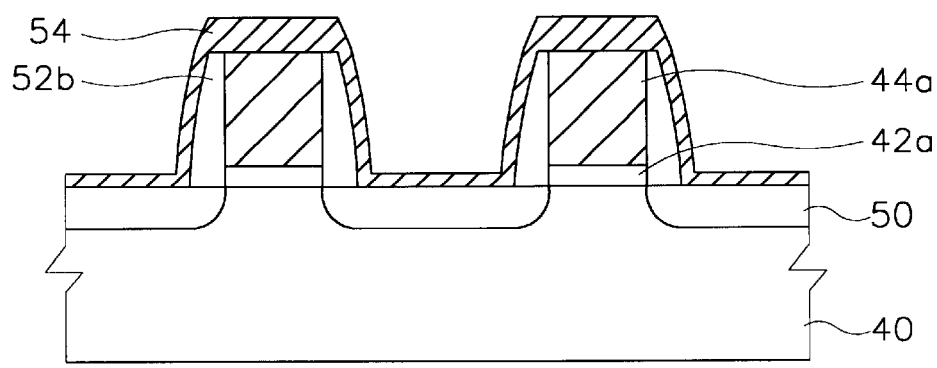

Referring to FIG. 2G, a stopping layer 54 is continuously formed on the top portion of the polysilicon layer pattern 44a, a sidewall of the gate spacer 52b and the surface of the semiconductor substrate 40. The stopping layer 54 indicates a finishing point of polishing in a planarization process of a subsequently formed insulating interlayer. Furthermore, the stopping layer 54 is used to self-align contacts that are formed in a subsequent process between the gate electrodes. The stopping layer 54 includes an insulating material, such as a nitride. Since the polysilicon layer pattern 44a has a uniform thickness, the stopping layer 54 is uniformly formed on an upper surface of the respective polysilicon layer pattern 44a.

Figure 2H:
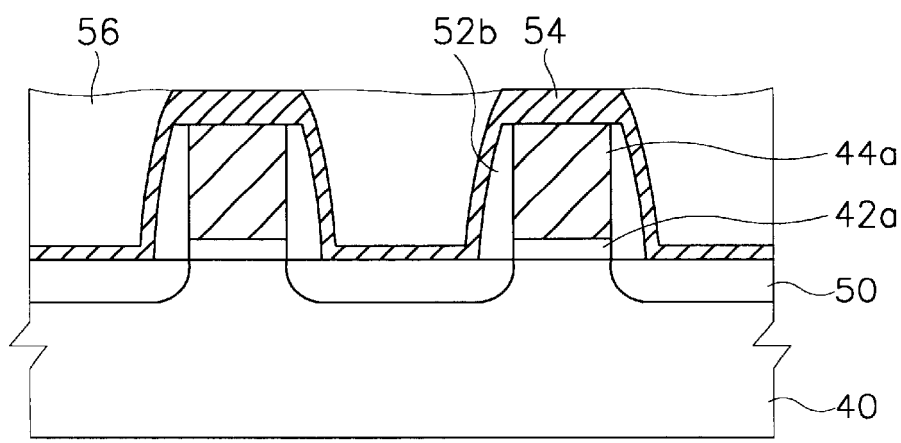
Figure 2I:
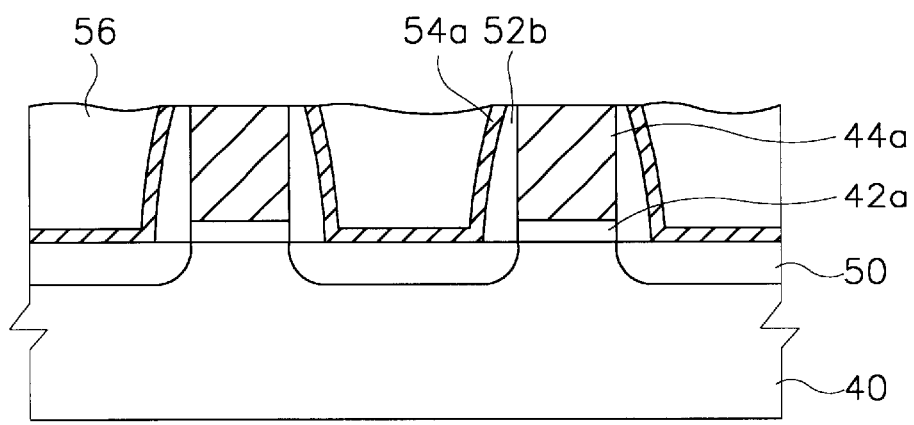

Referring to FIGS. 2H and 2I, an insulating interlayer 56 is formed on the resultant, shown in FIG. 2G, including the stopping layer 54. Then, a planarization process is performed to expose the upper surface of the polysilicon layer pattern 44a.

Referring firstly to FIG. 2H, the insulating interlayer 56 is formed on the resultant, shown in FIG. 2G, so that the resultant structure including the stopping layer 54 is covered with the insulating interlayer 56. Then, the insulating interlayer 56 is chemically and mechanically polished to expose the stopping layer 54, as shown in FIG. 2H. In order to precisely polish the insulating interlayer 56 in the chemical and mechanical polishing process, the polishing rate of the stopping layer 54 must be slower than the polishing rate of the insulating interlayer 56. For this purpose, the polishing process is performed using a slurry that has a selectivity ratio of the insulating interlayer 56 to the stopping layer 54, of about 4:1 to 10:1. After the chemical and mechanical polishing process, the stopping layer 54 remaining on the top portion of the respective polysilicon layer pattern 44a has a uniform thickness.

Referring to FIG. 2I, the stopping layer 54 exposed in the chemical and mechanical polishing process is removed in order to expose the top portion of the polysilicon layer pattern 44a. The stopping layer 54 remaining on the top portion of the polysilicon layer pattern and the insulating interlayer 56 surrounding it are then removed using a non-selective etching process to obtain a planar surface. The removal of the exposed stopping layer 54 remaining on top of the polysilicon layer pattern 44a and the insulating interlayer 56 surrounding it can be carried out using a dry etching process or a wet etching process.

In the dry etching process, the removal of the exposed stopping layer 54 may be performed using a mixed gas of $CHF_3$ and $CF_4$ or a mixed gas of $CHF_3$ and argon. In the wet etching process, on the other hand, the semiconductor substrate is dipped in a chemical including the phosphoric acid in order to remove the exposed stopping layer 54.

When the exposed stopping layer 54 is removed in the wet etching process using the chemicals including the phosphoric acid, the stopping layer 54a formed on the sidewall of the gate spacer 52b is also partially removed. Therefore, the removal of the exposed stopping layer 54 is preferably performed in the dry etching process.

As described above, since the stopping layer 54 on the upper portion of the respective polysilicon layer pattern 44a has a uniform thickness, the stopping layer 54 on the upper portion of the polysilicon layer pattern 44a can be uniformly etched in the etching process. Furthermore, as the stopping layer 54 is uniformly etched, the polysilicon layer pattern 44a also has a uniform thickness and a uniform exposed surface area.

Figure 2J:
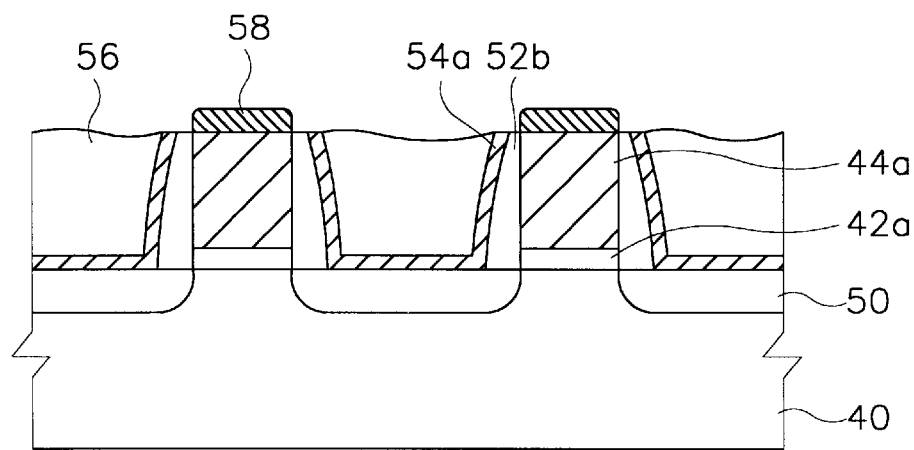

Referring to FIG. 2J, a metal silicide layer 58 is selectively formed, using a standard photolithography technique, on the upper surface of the polysilicon layer pattern 44a to obtain a gate electrode. The exposed portion of the polysilicon layer pattern 44a is subjected to silicidation in order to form the metal silicide layer 58 after forming a metal layer on the polysilicon layer. The metal silicide layer includes any one of the materials selected from the group consisting of cobalt silicide ($CoSi_x$), tungsten silicide ($WSi_x$), titanium silicide ($TiSi_x$) and tantalum silicide ($TaSi_x$). The metal silicide layer 58 has a characteristic of decreasing the resistance of the gate electrode.

As the polysilicon layer pattern 44a has a uniform exposed surface area, the metal silicide layer 58 also can be uniformly deposited across the wafer surface. Since the polysilicon layer pattern 44a and the metal silicide layer 58, which are provided as the gate electrode, are uniformly formed, the difference in the resistance between the gate electrodes across the wafer can be minimized. As a result, the reliability of the semiconductor device including the gate electrodes can be improved.

FIGS. 3A to 3K illustrate sectional views of stages in a method of manufacturing a non-volatile memory device according to the second embodiment of the present invention.

Figure 3A:
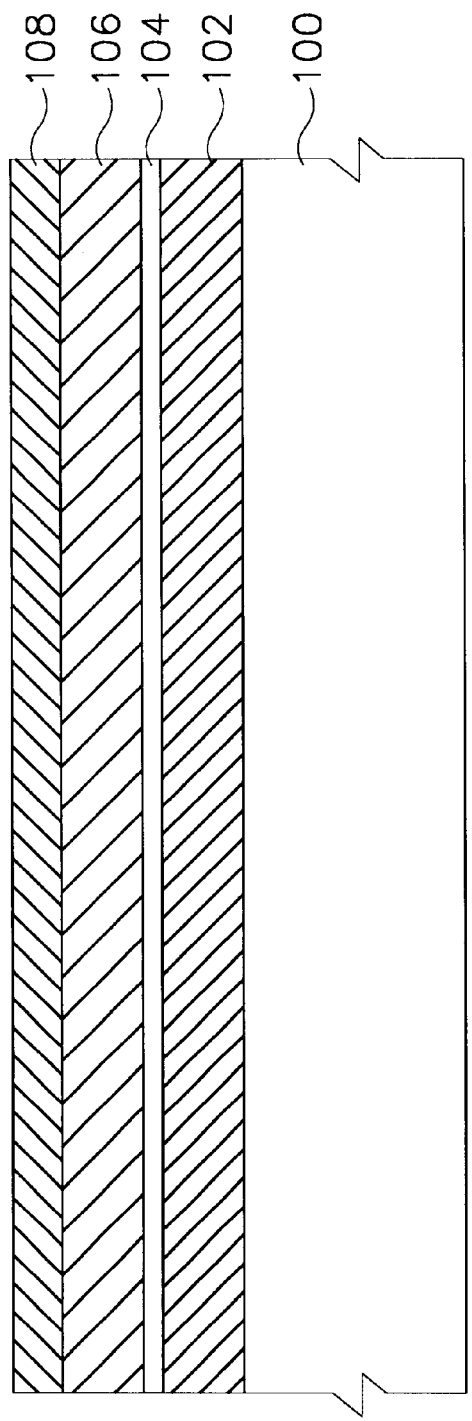

Referring to FIG. 3A, a semiconductor substrate 100 comprised of silicon has an active area and a field area divided by a conventional isolation process. A silicon oxide film is grown on the semiconductor substrate 100 having the active area and the field area in order to form a gate oxide film (not shown) of a cell transistor, for an example, a tunnel oxide film. In the case of exposing the semiconductor substrate to atmosphere, a natural oxide film is formed on the semiconductor substrate because the semiconductor substrate is reacted with oxygen in the atmosphere. As described above, the natural oxide film is formed on the semiconductor substrate 100. In the present embodiment, the gate oxide film (not shown) is further grown on the semiconductor substrate to a thickness of about 50-100 Å.

A conductive layer 102 that is to be used as a floating gate is deposited on the gate oxide film (not shown) to a thickness of about 2000 Å via a low-pressure chemical vapor deposition (LPCVD) process. Preferably, the conductive layer 102 is comprised of polysilicon. Then, an N-type impurity is doped into the conductive layer 102 at a high density by one of the general doping processes such as $POCl_3$ diffusion, ion implanting or in-site doping.

A dielectric layer 104, for example, an ONO (oxide film/nitride film/oxide film) layer is deposited on the conductive layer 102. Particularly, after the conductive layer 102 is oxidized in order to grow a first oxide film having a thickness of about 100 Å, a nitride film is deposited on the first oxide film at a thickness of about 130 Å. Finally, a second oxide film is deposited on the nitride film to a thickness of about 40 Å to form the dielectric film 104 having a thickness of about 100-150 Å.

Continuously, a polysilicon layer 106 doped with an N-type impurity is formed on the dielectric layer 104, which is to be used as a control gate. Insulation material, such as a nitride, is deposited on the polysilicon layer 106 in order to form a hard mask layer 108, which is used as an etching mask in a subsequent process. The hard mask layer 108 is comprised of silicon nitride or silicon oxynitride. The required thickness of the hard mask layer 108 depends upon the layer formed under the hard mask layer 108 and a thickness of the underlying layer that is etched in a subsequent process. In the present embodiment, preferably, the hard mask layer 108 has a thickness of about 800-1500 Å.

Figure 3B:
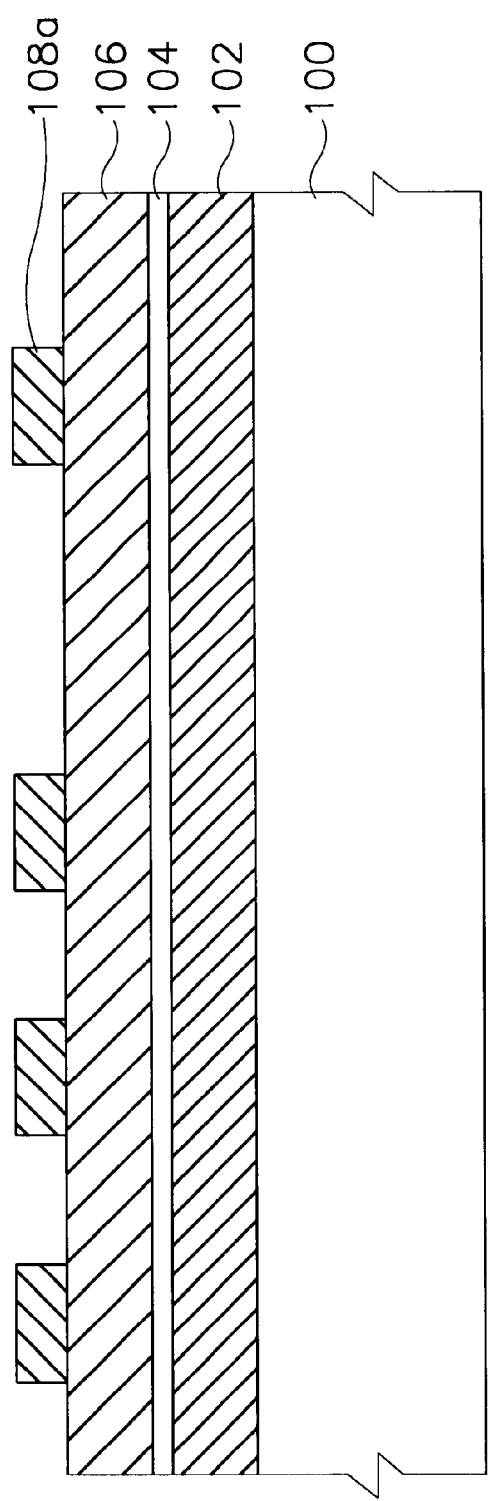

Referring to FIG. 3B, the hard mask layer 108 is selectively etched to expose the polysilicon layer 106 under the hard mask layer 108, so that a hard mask pattern 108a is formed. The gate electrode is subsequently formed below the hard mask pattern 108a. That is, a photoresist pattern (not shown) is formed on an upper portion of the hard mask layer 108. Then, the hard mask layer 108 is etched via a general photolithography process in which the photoresist pattern is used as an etching mask. As a result, the hard mask layer 108 becomes the hard mask pattern 108a.

Figure 3C:
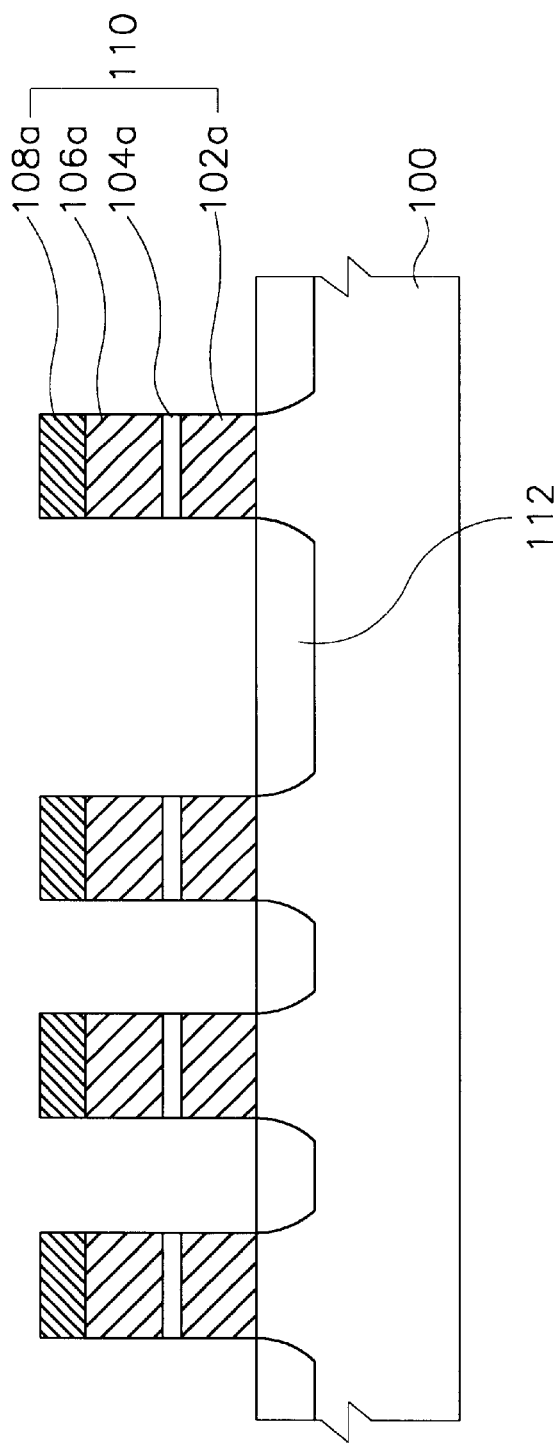

Referring to FIG. 3C, the underlying films are subsequently etched via an anisotropic etching process in which the hard mask pattern 108a is used as an etching mask in order to form a gate structure 110 in which the gate oxide pattern (not shown), the conductive layer pattern 102a, the dielectric film pattern 104a, the polysilicon layer pattern 106a and the hard mask pattern 108a are stacked. Then, using the gate structure 110 as an ion implant mask, an N-type impurity is implanted into an NMOS transistor area while a P-type impurity is doped into a PMOS transistor area, to form source/drain regions 112 having a low resistivity.

When the anisotropic etching process is performed to form the gate structure 110, however, the upper surface of the hard mask pattern 108a used as the etching mask is partially etched by an impact of the ion beam. In addition, the hard mask pattern 108a may be non-uniformly etched according to the density of a peripheral pattern and a position of the semiconductor substrate on which the hard mask pattern is formed. Accordingly, after the etching process is performed, the hard mask pattern 108a remaining on the top portion of the respective gate construction has a varying thickness at different locations on the wafer surface.

When the etching process is performed under a condition of the present embodiment, the thickness of the hard mask pattern 108a is reduced by about 100-500 Å during the etching process as compared to the thickness thereof before the etching process. Furthermore, the hard mask pattern 108a has a thickness variation of about 400-500 Å depending on the density of the peripheral pattern and the position of the hard mask pattern on the semiconductor substrate.

Figure 3D:
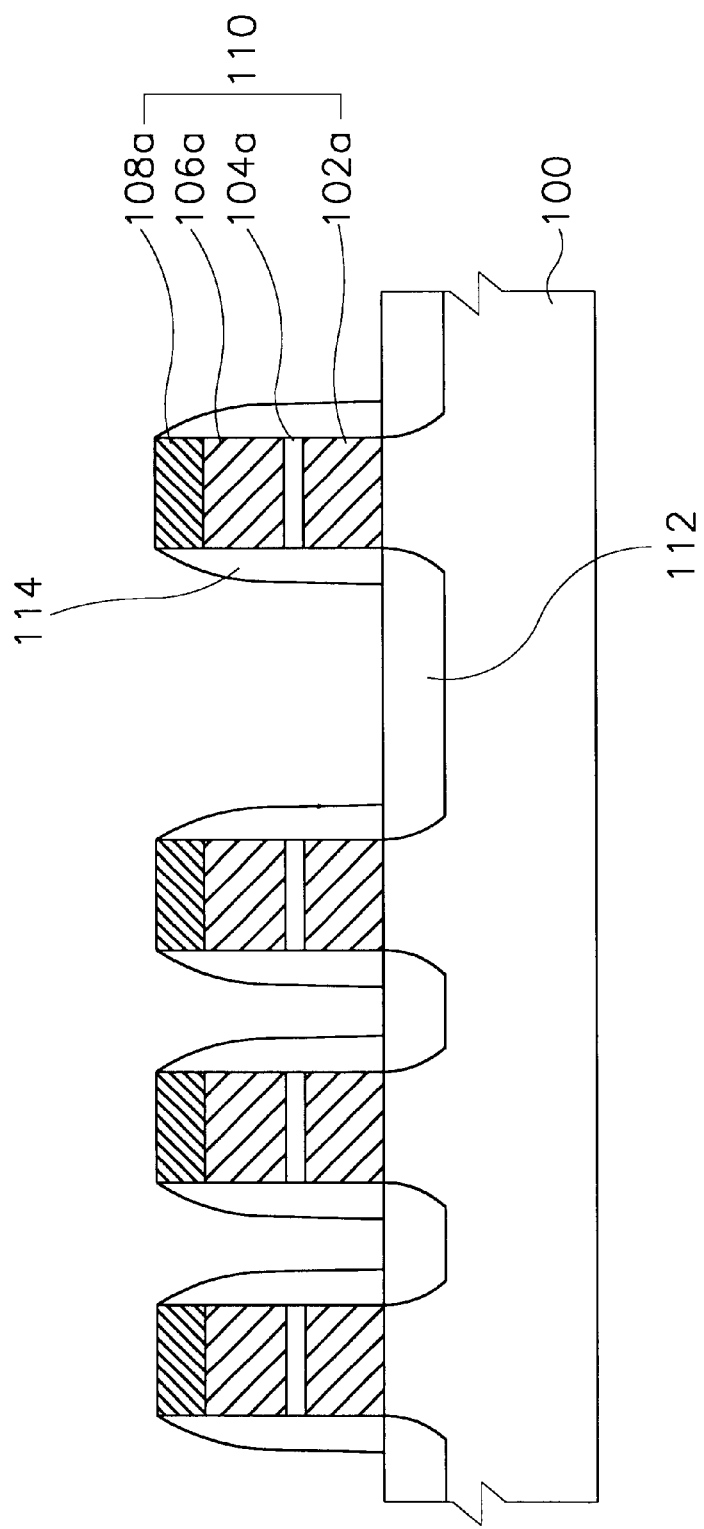

Referring to FIG. 3D, an oxide film is formed on the gate structure 110 and the semiconductor substrate 100 and then the oxide film is anisotropically etched in order to form a gate spacer 114 on a sidewall of the gate structure 110. Preferably, the gate spacer includes an oxide based insulating material. The gate spacer 114 including the oxide film prevents damage to the sidewall of the gate structure 110 during the subsequent processing.

Figure 3E:
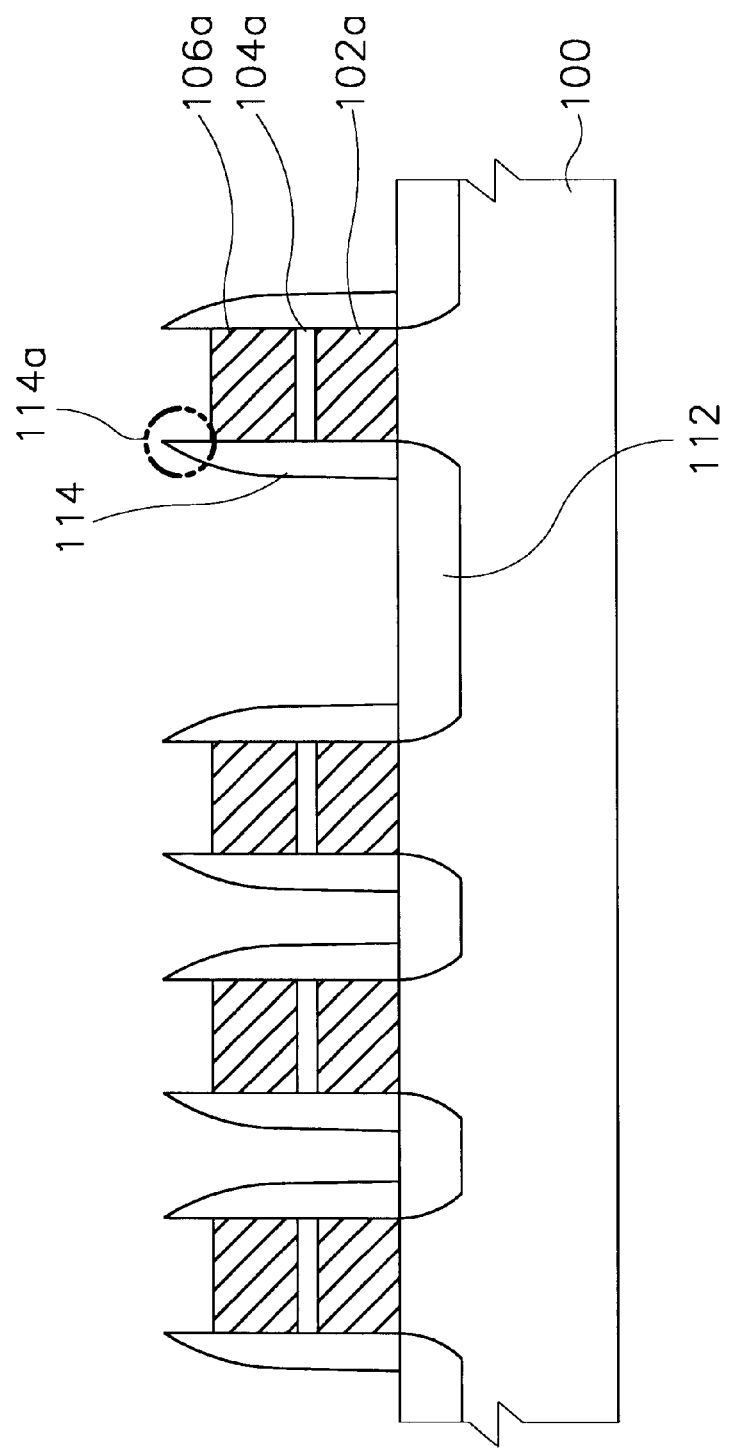

Referring to FIG. 3E, the hard mask pattern formed on the top portion of the gate structure 110 is removed to expose the upper surface of the polysilicon layer pattern 106a.

The hard mask pattern 108a can be removed using the phosphoric acid stripping process in which the hard mask pattern 108a is dipped into the chemical solution including the phosphoric acid. When the hard mask pattern 108a is removed, the polysilicon layer pattern 106a under the hard mask pattern 108a is exposed. The hard mask pattern 108a may be removed by a dry etching process as well as the above phosphoric acid stripping process.

Since the surface of the semiconductor substrate 100 on which the gate structure 110 is not formed is exposed, the ion beam used for etching the hard mask pattern 108a causes an impact damage on the surface of the semiconductor substrate 100, resulting in process related defects including defects on the substrate surface. When the phosphoric acid stripping process is used for removing the hard mask pattern 108a, the hard mask pattern 108a can be effectively removed without having an effect on the underlying films or on the surface of the semiconductor substrate 100.

When the hard mask pattern 108a is removed, the top portion of the gate spacer 114a that was around the hard mask pattern 108a is projected above the polysilicon layer pattern 106a.

Referring to FIG. 3F, the top portion of the gate spacer 114a that was around the hard mask pattern 108a is removed in order to planarize an upper portion of the gate spacer 114 and the polysilicon layer pattern 106a. In order to remove the projected portion of the gate spacer 114a, the semiconductor substrate including the gate spacer 114 is immersed in the hydrofluoric acid (HF) solution for thirty seconds. When the semiconductor substrate is dipped in the hydrofluoric acid solution, the projected portion of the gate spacer 114a can be removed while the surfaces of the semiconductor substrate 100 and the polysilicon layer pattern 106a are cleaned due to the etching characteristic of the hydrofluoric acid (HF) solution. After the dip in the HF solution, the top of the remaining gate spacer 114b is planar with the polysilicon layer pattern 106a.

Figure 3G:
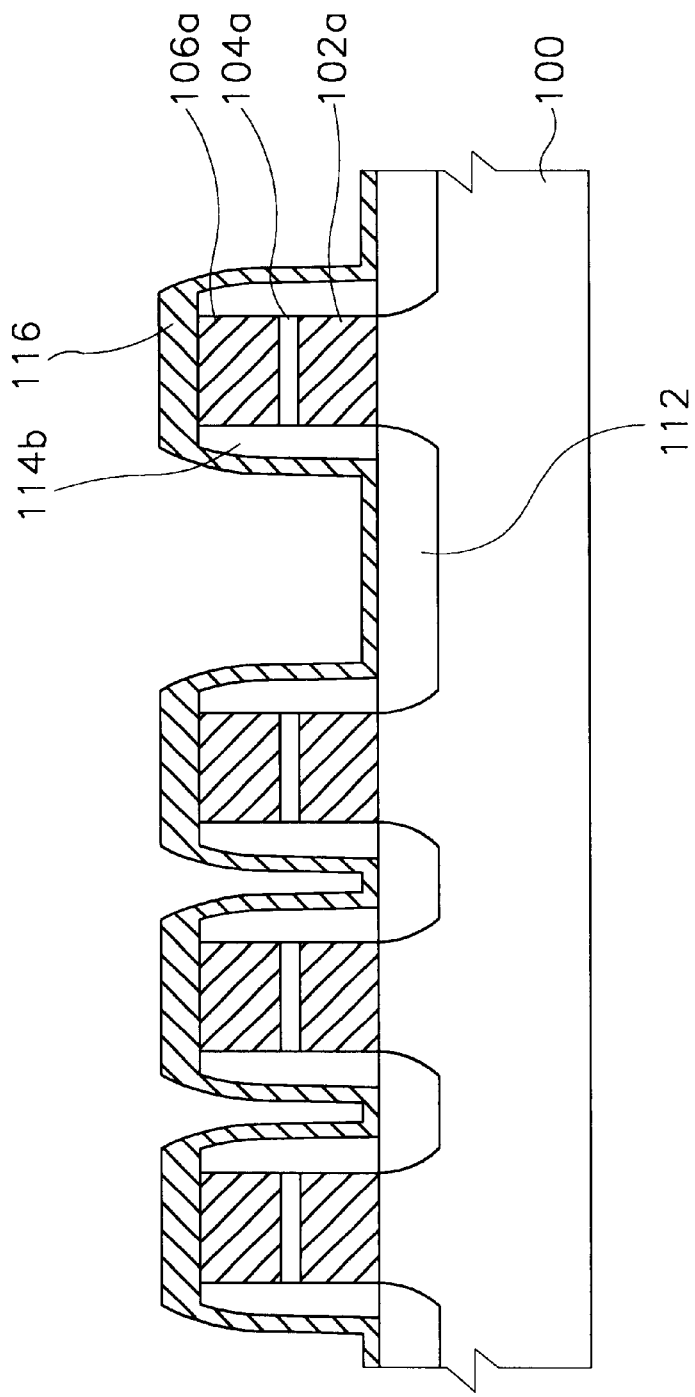

Referring to FIG. 3G, a stopping layer 116 is continuously formed on the top portion of the exposed polysilicon layer pattern 106a, a sidewall of the gate spacer 114b and the surface of the semiconductor substrate 100. The stopping layer 116 indicates a finishing of polishing in a planarization process of a subsequently formed insulating interlayer. Furthermore, the stopping layer 116 is used to self-align contacts formed in a subsequent process between the gate electrodes. The stopping layer 116 is comprised of an insulating material, such as a nitride, to have a thickness of about 500-800 Å.

The stopping layer 116 is uniformly formed on an upper surface of the respective polysilicon layer pattern 106a since the polysilicon layer pattern 106a has a uniform thickness.

Figure 3H:
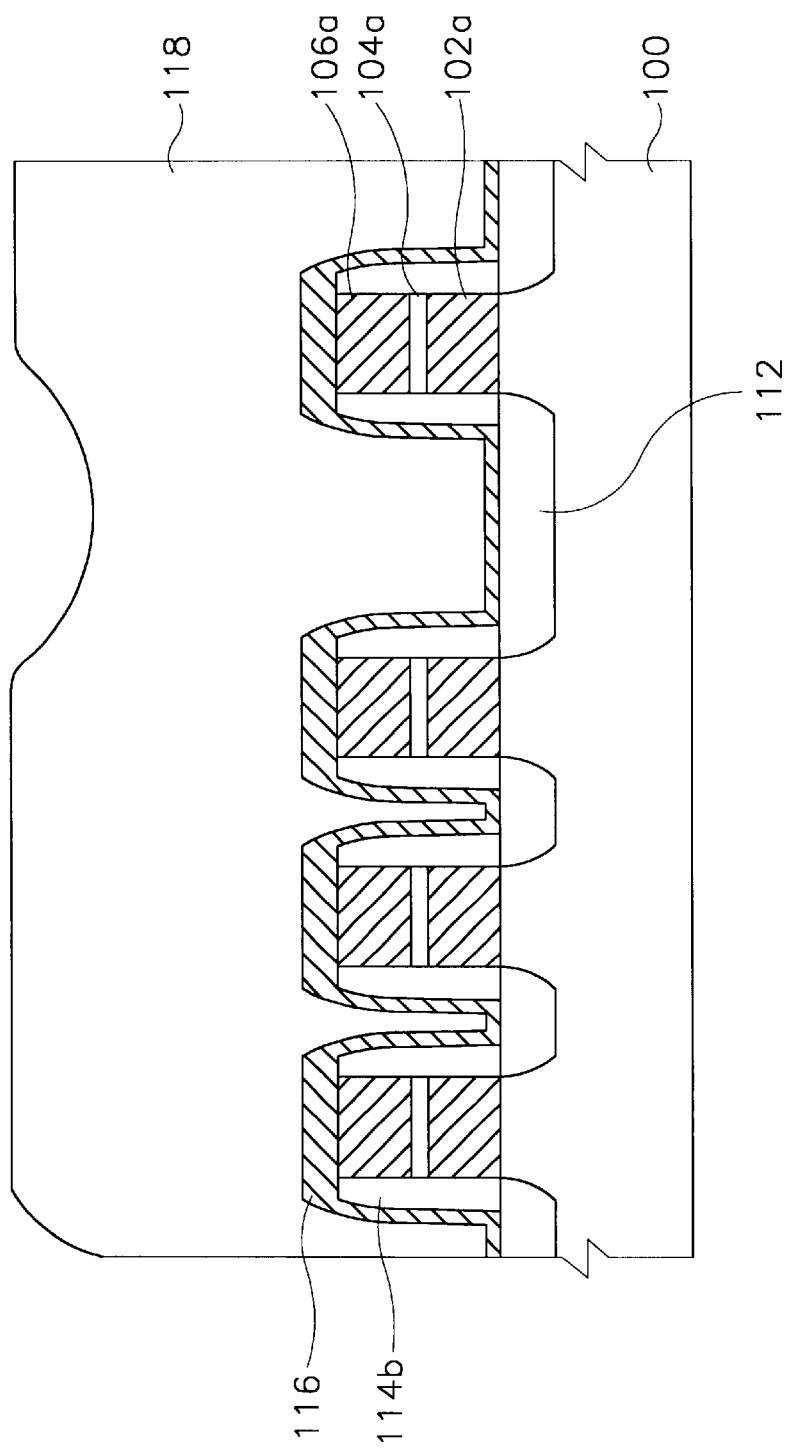

Referring to FIG. 3H, an insulating interlayer 118 is formed on the stopping layer 116 to cover the resultant structure shown in FIG. 3G. For example, the insulating interlayer 118 may be formed by depositing a first insulating layer and a second insulating layer. The first insulating layer is formed by depositing a high density plasma (HDP) oxide to a thickness of about 5000-6000 Å and the second insulating layer is formed by depositing plasma enhanced-tetra-ethyl-ortho-silicate (PE-TEOS) oxide film on the first insulating layer to a thickness of about 4000-8000 Å. As the high-density plasma oxide film is used as the insulating layer, the oxide film is filled in gaps between the gate structures which are formed to be adjacent to each other.

Figure 3I:
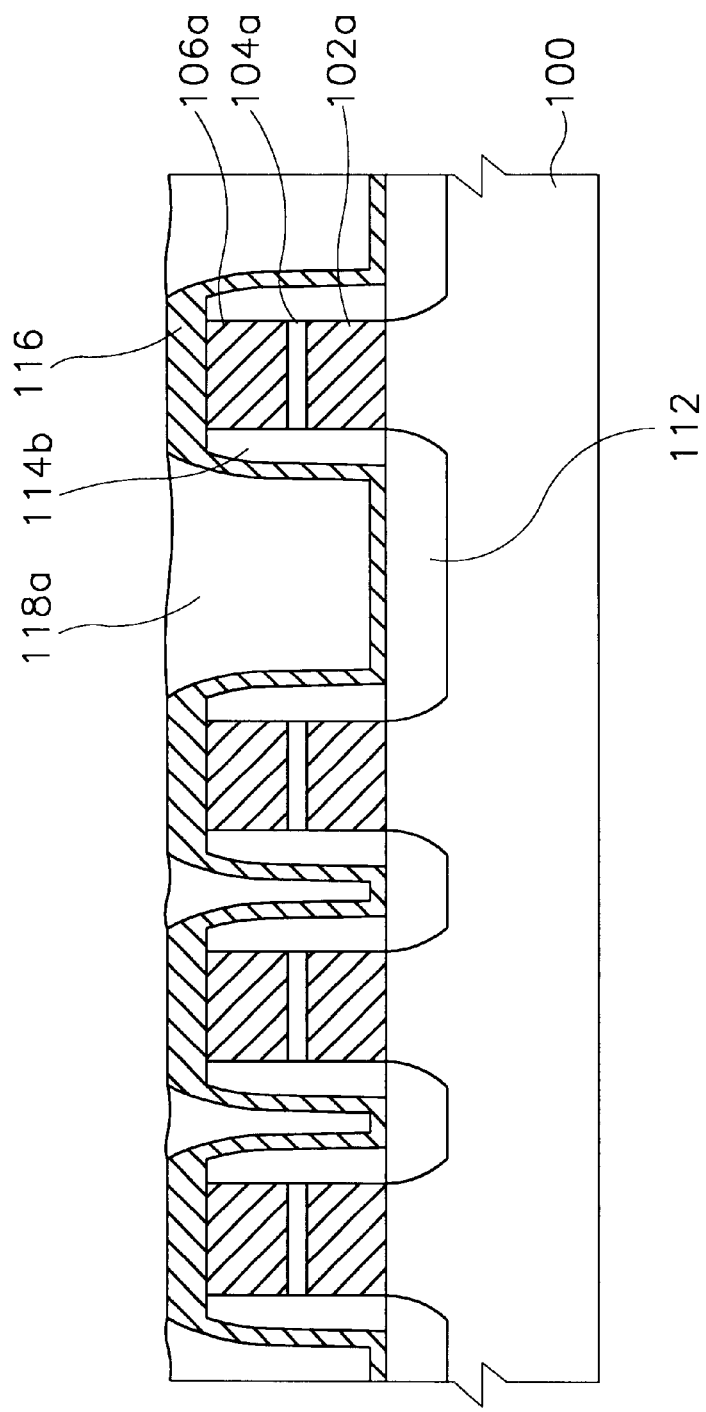
Figure 3J:
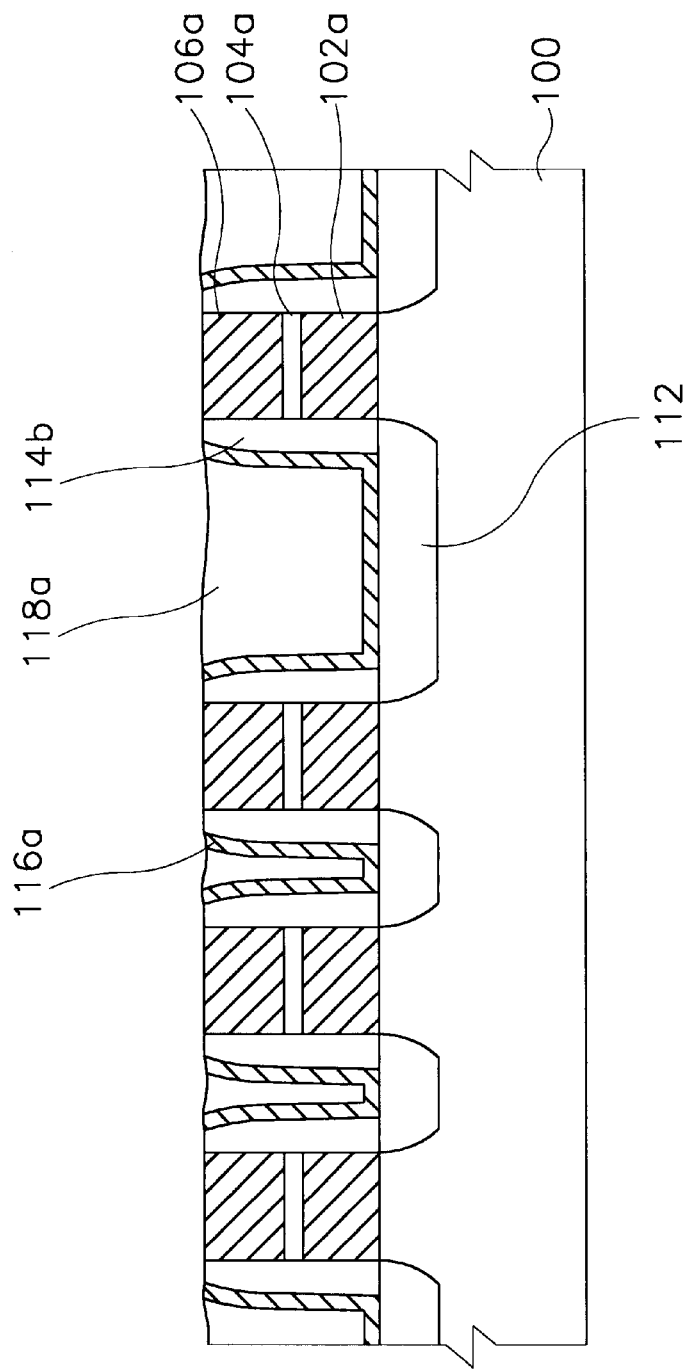

Referring to FIGS. 3I and 3J, the structure in FIG. 3H is planarized so that the polysilicon layer pattern 106a is exposed.

Referring firstly to FIG. 3I, the insulating interlayer 118 is polished by a chemical and mechanical polishing (CMP) process until the stopping layer 116 under the insulating interlayer 118 is exposed. At this stage, the top surface of the remaining insulating interlayer 118a is planarized with the top surface of the stopping layer 116. Since the stopping layer 116 formed on the upper surface of the respective polysilicon layer pattern 106a has a uniform thickness, the thickness of the stopping layer 116 has not changed significantly during the polishing process.

In order to precisely polish the insulating interlayer 118 in the chemical and mechanical polishing process, the polishing rate of the stopping layer 116 needs to be slower than the polishing rate of the insulating interlayer 118. Therefore, the polishing process is performed using a slurry having a selectivity ratio of the insulating interlayer 118 to the stopping layer 116, of about 4:1 to 10:1. When the slurry with such a high selectivity ratio is used for polishing the insulating interlayer 118, the damage of the stopping layer 116 can be minimized. The thickness variation of the stopping layer 116 remaining on the polysilicon layer pattern 106a can also be reduced which is caused by a varying pattern density at different locations, with the density of the patterns being small at the peripheral portion and the density of the patterns being large at the cell portion, and also due to variation in the polysilicon layer pattern thickness on the semiconductor substrate.

If the stopping layer 116 has a thickness of about 600 Å before the chemical and mechanical polishing process, the stopping layer 116 has a thickness of about 350-500 Å, depending on the density of the peripheral pattern and the position of the semiconductor substrate, after the insulating interlayer 118 is polished using the slurry having the selectivity ratio 4:1 of the insulating interlayer 118 with respect to the stopping layer 116. That is, the maximum variation in the thickness of the stopping layer 116 is about 100-250 Å.

Referring now to FIG. 3J, the stopping layer 116 formed on the upper surface of the polysilicon layer pattern 106a is removed. When the stopping layer 116 is removed from the upper surface of the polysilicon layer pattern 106a, the stopping layer 116a only remains on the sidewall of the gate spacer 14b. The removal of the stopping layer 116 can be performed using the dry etching process or the wet etching process.

In the dry etching process, the removal of the stopping layer 116 may be performed using a mixed gas of $CHF_3$ and $CF_4$ or a mixed gas of $CHF_3$ and argon. In the wet etching process, on the other hand, the semiconductor substrate is dipped in a chemical solution including the phosphoric acid in order to remove the stopping layer 116.

When the stopping layer 116 is removed via the wet etching process using the chemical solution including the phosphoric acid, the stopping layer 116 formed on the sidewall of the gate spacer 114b is partially removed as the etchant penetrates into the sidewall of the gate spacer 114b.

When a contact is formed between the gate electrodes after the gate electrodes are formed in a subsequent process, the stopping layer 116a formed on the sidewall of the gate spacer 114b can be used as a film for self-aligning the contacts. When the stopping layer 116a is partially removed from the sidewall of the gate spacer 114b, however, the process defects may be caused during the formation of the contact. Therefore, the stopping layer 116 is preferably removed in the dry etching process.

When the stopping layer 116, formed on the upper surface of the polysilicon layer pattern 106a, is removed via the dry etching process, the insulating interlayer 118a around the stopping layer 116 is also etched together with the stopping layer 116. The etchant used in this step does not have selectivity with respect to the stopping layer 116 and the insulating interlayer 118a, resulting in a planar surface at the end of this etching step. In addition, when the etching of the stopping layer 116 formed on the upper surface of the polysilicon layer pattern 106a is completed, plasma ions are forced to the upper surface of the polysilicon layer pattern 106a thereby causing damage on the surface of the polysilicon layer pattern 106a. Furthermore, as being impacted by the ions, the polysilicon layer pattern 106a is etched to have a reduced thickness.

As described above, since the hard mask pattern 108a is removed before the stopping layer 116 is formed, the stopping layer 116 formed on the respective polysilicon layer pattern 106a has a uniform thickness. Therefore, the stopping layer 116 formed on the respective polysilicon layer pattern 106a can be uniformly etched in the etching process. Accordingly, during the etching process a situation where the polysilicon layer pattern 106a has a non-uniform thickness and a different exposed area due to its non-uniform thickness rarely arises.

Figure 3K:
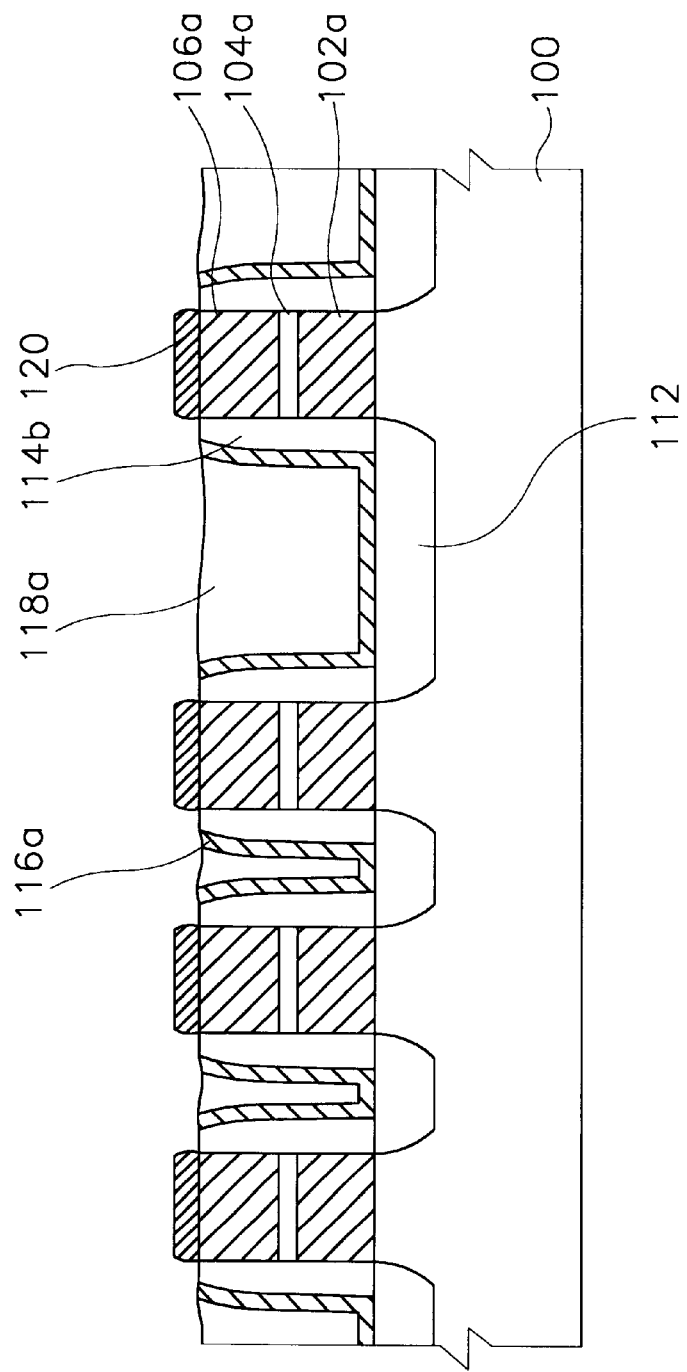

Referring to FIG. 3K, a metal silicide layer 120 is selectively deposited on the exposed portion of the polysilicon layer pattern 106a to form the gate electrode using a standard photolithographic technique. The metal silicide layer 120 may be formed using cobalt silicide $CoSi_x$, tungsten silicide $WSi_x$, titanium silicide $TiSi_x$, tantalum silicide $TaSi_x$, etc. The exposed portion of the polysilicon layer pattern 106a is subjected to silicidation in order to form the metal silicide layer 120 (after forming a metal layer on the polysilicon layer). The metal silicide layer 120 can decrease the resistance of the gate electrode.

Since the metal silicide layer 120 is comprised of a metal material having a high conductivity, the metal silicide layer 120 has a great influence on the resistance of the gate electrode. Therefore, the metal suicide layer 120 must be uniformly formed on the respective polysilicon layer pattern 106a so that the difference in the resistance of the gate electrodes is not generated between the gate electrodes.

As the polysilicon layer pattern 106a has the uniformly exposed area, the silicidation of the exposed area of the polysilicon layer pattern 106a is accomplished uniformly. As a result, the metal silicide layer 120 is formed uniformly. Therefore, the difference in the resistance of the gate electrodes can be minimized. Furthermore, the reliability of the non-volatile memory device can be improved.

TABLE 1

|    | Upper portion | | Center portion | | Lower portion | | Side portion | | Other side portion | | Difference of thickness |
|----|------|------|------|------|------|------|------|------|------|------|------|
|    | cell | peri | cell | peri | cell | peri | cell | peri | cell | peri |      |
| #1 | 1200 | 1000 | 720  | 700  | 790  | 350  | 860  | 730  | 570  | 550  | 850  |
| #2 | 1140 | 1280 | 800  | 1000 | 1120 | 1240 | 1120 | 1270 | 1040 | 1140 | 480  |
| #3 | 490  | 390  | 380  | 350  | 540  | 470  | 440  | 390  | 470  | 350  | 190  |

Table 1 shows the thickness of the nitride films remaining on the polysilicon layer pattern after the chemical and mechanical polishing process was performed to expose the stopping layer in the respective non-volatile memory devices that were manufactured according to the conventional method and a method of the embodiment of the present invention. The nitride film in the conventional method includes the stopping layer and the hard mask pattern, where as in the preferred embodiments of the present invention, the nitride film is entirely constituted by the stopping layer.

As described above, the gate electrodes of the semiconductor device have a different resistance due to the non-uniform thickness of the nitride film remaining on the polysilicon layer pattern after the polishing process. Table 1 shows data of the thickness of the nitride film remaining at the cell area and peripheral area (referred to as "peri") in the respective portions (upper portion, central portion, lower portion, left side portion and right side portion) of the semiconductor substrate. In Table 1, the unit of measure for the thickness is angstroms.

Referring to Table 1, data #1 are values of the thickness of the nitride film that were measured at the respective portions on the semiconductor substrate according to the conventional method after the polishing process. The nitride film had the stopping layer and the hard mask pattern for the conventional method. The semiconductor substrate was polished using the slurry without the selectivity to the insulation interlayer with respect to the nitride film. Therefore, the nitride film has a non-uniform thickness and the thickness variation of the nitride film is very large across the semiconductor substrate surface. The maximum of the thickness variation across the wafer surface is 850 Å.

Data #2 are values of the thickness of the nitride film that were measured at the respective portions on the semiconductor substrate according to the conventional art after performing the polishing process using a selective slurry. The nitride film included the stopping layer and the hard mask pattern. The semiconductor substrate was polished using the slurry having a selectivity ratio greater than 4:1 of the insulating interlayer to the nitride film. Therefore, the insulating interlayer was polished in the polishing process while the nitride film is polished only slightly. The nitride film according to data #2 has a thickness greater than the nitride film according to data #1, while having a small variation of the thickness across the semiconductor substrate. The maximum thickness difference of the nitride film across the wafer according to data #2 is 480 Å. However, the nitride film remaining on the wafer after polishing according to data #2 is thicker as compared to data #1. Accordingly, there is a disadvantage because it takes a long time to remove the nitride film.

Data #3 are values of the thickness of the nitride film that were measured at the respective portions on the semiconductor substrate according to an embodiment of the present invention after the polishing process. In the present invention, since the hard mask pattern was already removed before the stopping layer was formed, the nitride film only includes the stopping layer. The semiconductor substrate was polished using the slurry having a selectivity ratio greater than 4:1 of the insulating interlayer to the nitride film.

The nitride film according to data #3 had a thickness thinner than the nitride film according to data #1 and #2, while having a small variation of the thickness in the respective portions on the semiconductor substrate. The maximum difference in the thickness of the nitride film according to data #3 is 190 Å. Therefore, it can be noted that the variation of the thickness of the nitride film is remarkably small in the present invention as compared to the conventional art.

In the present invention, since the hard mask pattern is removed before the stopping layer is formed as described above, it is possible to form the polysilicon layer pattern with a uniform thickness and, consequently, a uniform exposed area. Accordingly, the difference in the resistances between the gate electrodes across the wafer can be minimized and the reliability of the semiconductor device can be improved.

Although preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A method of forming a gate electrode of a semiconductor device, comprising:
   a) sequentially stacking an oxide film pattern, a polysilicon layer pattern and a hard mask pattern in that order on a semiconductor substrate to form a gate structure;
   b) forming a gate spacer on a sidewall of the gate structure, the gate spacer including an oxide-based insulating material;
   c) removing the hard mask pattern, which is stacked on a top portion of the gate structure, to expose the polysilicon layer pattern; and
   d) planarizing the polysilicon layer pattern and a top portion of the gate spacer by removing a portion of the gate spacer that was around the hard mask pattern and is projected above the polysilicon layer pattern.

2. A method of forming a gate electrode of a semiconductor device as claimed in claim 1, wherein the polysilicon layer is doped with impurities.

3. A method of forming a gate electrode of a semiconductor device as claimed in claim 1, wherein the hard mask pattern is comprised of a nitride based insulating material.

4. A method of forming a gate electrode of a semiconductor device as claimed in claim 3, wherein the hard mask pattern is removed using an etchant including a phosphoric acid.

5. A method of forming a gate electrode of a semiconductor device as claimed in claim 1, wherein a portion of the gate spacer, which was around the hard mask pattern, is removed using a hydrofluoric acid (HF) solution.

6. A method of forming a gate electrode of a semiconductor device as claimed in claim 1, after planarizing the polysilicon layer pattern and a top portion of the gate spacer, further comprising:
   e) continuously forming a stopping layer on the polysilicon layer pattern, the gate spacer and the semiconductor substrate;
   f) forming an insulating interlayer on the stopping layer; and
   g) exposing a surface of the polysilicon layer pattern by planarizing the insulating interlayer.

7. A method of forming a gate electrode of a semiconductor device as claimed in claim 6, wherein the stopping layer is formed by depositing a nitride-based insulating material on the polysilicon layer pattern.

8. A method of forming a gate electrode of a semiconductor device as claimed in claim 6, wherein exposing the surface of the polysilicon layer pattern comprises:
   performing a chemical and mechanical polishing until the surface of the stopping layer is exposed; and
   etching the exposed stopping layer to expose the surface of the polysilicon layer pattern.

9. A method of forming a gate electrode of a semiconductor device as claimed in claim 8, wherein the etching of the stopping layer is accomplished by a wet etching or a dry etching process.

10. A method of forming a gate electrode of a semiconductor device as claimed in claim 9, wherein the dry etching is performed using a mixed gas of $CHF_3$ and $CF_4$ or a mixed gas of $CHF_3$ and argon.

11. A method of forming a gate electrode of a semiconductor device as claimed in claim 8, wherein the chemical and mechanical polishing is accomplished using a slurry having a polishing selectivity ratio of the insulating interlayer to the stopping layer of about 4:1 to 10:1.

12. A method of forming a gate electrode of a semiconductor device as claimed in claim 6, further comprising:
   h) selectively forming a metal silicide layer on the surface of the exposed polysilicon layer after exposing the surface of the polysilicon layer pattern.

13. A method of forming a gate electrode of a semiconductor device as claimed in claim 12, wherein the metal silicide layer is comprised of any one of the materials selected from the group consisting of cobalt silicide ($CoSi_x$), tungsten silicide ($WSi_x$), titanium silicide ($TiSi_x$) and tantalum silicide ($TaSi_x$).

14. A method of forming a non-volatile semiconductor device comprising:
   a) sequentially forming an oxide film, a conductive layer, a dielectric layer, a polysilicon layer and a hard mask layer in that order on a semiconductor substrate, the hard mask layer being comprised of a nitride based film;
   b) etching a portion of the hard mask layer to form a hard mask pattern;
   c) sequentially etching the polysilicon layer, the dielectric layer, the conductive layer and the oxide film continuously using the hard mask pattern as an etching mask to form a gate structure in which an oxide film pattern, a conductive layer pattern, a dielectric film pattern, a polysilicon layer pattern and a hard mask pattern are stacked on the semiconductor substrate;

d) forming a gate spacer on a sidewall of the gate structure, the gate spacer including an oxide-based insulating material;

e) removing the hard mask pattern, which is stacked on a top portion of the gate structure, to expose the polysilicon layer pattern;

f) planarizing the polysilicon layer pattern and a top portion of the gate spacer by removing a top portion of the gate spacer that was around the hard mask pattern and is projected above the exposed polysilicon layer pattern;

g) continuously forming a stopping layer on the exposed polysilicon layer pattern, the gate spacer and the semiconductor substrate;

h) forming an insulating interlayer on the stopping layer; and i) exposing a surface of the polysilicon layer pattern by planarizing the insulating interlayer.

15. A method of forming a non-volatile semiconductor device as claimed in claim 14, wherein the conductive layer is comprised of doped polysilicon.

16. A method of forming a non-volatile semiconductor device as claimed in claim 14, wherein the dielectric layer is comprised of a oxide-nitride-oxide (ONO) film layer.

17. A method of forming a non-volatile semiconductor device as claimed in claim 14, wherein the hard mask layer is comprised of silicon nitride or silicon oxynitride.

18. A method of forming a non-volatile semiconductor device as claimed in claim 14, wherein the hard mask pattern is removed using an etchant including a phosphoric acid.

19. A method of forming a non-volatile semiconductor device as claimed in claim 14, wherein the gate spacer, which was around the hard mask pattern, is removed using hydrofluoric acid solution.

20. A method of forming a non-volatile semiconductor device as claimed in claim 14, wherein the stopping layer is comprised of a nitride-based insulating material.

21. A method of forming a non-volatile semiconductor device as claimed in claim 14, wherein the insulating interlayer is formed of a first insulating layer and a second insulating layer.

22. A method of forming a non-volatile semiconductor device as claimed in claim 21, wherein the first insulating layer is a high density plasma (HDP) oxide.

23. A method of forming a non-volatile semiconductor device as claimed in claim 21, wherein the second insulating layer is a plasma enhanced-tetra-ethyl-ortho-silicate (PE-TEOS) oxide.

24. A method of forming a non-volatile semiconductor device as claimed in claim 14, wherein exposing the surface of the polysilicon layer pattern comprises:

performing a chemical and mechanical polishing until a surface of the stopping layer is exposed; and etching the exposed stopping layer to expose the surface of the polysilicon layer pattern.

25. A method of forming a non-volatile semiconductor device as claimed in claim 24, wherein the step of etching the stopping layer is accomplished by a wet etching or a dry etching process.

26. A method of forming a non-volatile semiconductor device as claimed in claim 25, wherein the dry etching process is performed using a mixed gas of $CHF_3$ and $CF_4$ or a mixed gas of $CHF_3$ and argon.

27. A method of forming a non-volatile semiconductor device as claimed in claim 24, wherein the chemical and mechanical polishing is accomplished using a slurry having a polishing selection ratio of the insulating interlayer to the stopping layer of about 4:1 to 10:1.

28. A method of forming a non-volatile semiconductor device as claimed in claim 14, further comprising selectively forming a metal silicide layer on the surface of the exposed polysilicon layer after exposing the surface of the polysilicon layer pattern.

29. A method of forming a non-volatile semiconductor device as claimed in claim 28, wherein the metal silicide layer is comprised of any one of the materials selected from the group consisting of cobalt silicide ($CoSi_x$), tungsten silicide ($WSi_x$), titanium silicide ($TiSi_x$) and tantalum silicide ($TaSi_x$).

* * * * *